United States Patent
Kimoto et al.

(10) Patent No.: US 11,261,517 B2
(45) Date of Patent: Mar. 1, 2022

(54) SLIDING MEMBER WITH CARBON TRANSFER LAYER

(71) Applicants: DAICEL CORPORATION, Osaka (JP); TOHOKU UNIVERSITY, Sendai (JP)

(72) Inventors: Norihiro Kimoto, Tokyo (JP); Tomohiro Goto, Tokyo (JP); Koshi Adachi, Sendai (JP); Tsubasa Takahashi, Sendai (JP)

(73) Assignees: DAICEL CORPORATION, Osaka (JP); TOHOKU UNIVERSITY, Sendai (JP)

( * ) Notice: Subject to any disclaimer, the term of this patent is extended or adjusted under 35 U.S.C. 154(b) by 108 days.

(21) Appl. No.: 16/665,581

(22) Filed: Oct. 28, 2019

(65) Prior Publication Data

US 2020/0141446 A1 May 7, 2020

(30) Foreign Application Priority Data

Nov. 6, 2018 (JP) .............................. JP2018-209298

(51) Int. Cl.
*C23C 16/26* (2006.01)
*C23C 14/16* (2006.01)
(Continued)

(52) U.S. Cl.
CPC .............. *C23C 14/16* (2013.01); *C01B 32/05* (2017.08); *C23C 14/0605* (2013.01);
(Continued)

(58) Field of Classification Search
CPC ................................. C01B 32/25; C23C 16/26
(Continued)

(56) References Cited

U.S. PATENT DOCUMENTS

2007/0078067 A1\* 4/2007 Nakagawa .............. C23C 16/26
508/363
2012/0308949 A1\* 12/2012 Hirose .................... C23C 16/50
428/408
(Continued)

FOREIGN PATENT DOCUMENTS

JP 2008-116268 A 5/2008
JP 2014-62326 A 4/2014
(Continued)

OTHER PUBLICATIONS

Third Party Submission for Japanese Applicatinn No. 2018-209298, dated Nov. 8, 2021.

*Primary Examiner* — Archene A Turner
(74) *Attorney, Agent, or Firm* — Birch, Stewart, Kolasch & Birch, LLP

(57) ABSTRACT

A sliding member includes a carbon transfer layer and can superiorly effectively decrease friction and reduce wear. A method produces the sliding member. The sliding member includes a substrate and a carbon transfer layer. The carbon transfer layer is disposed on the surface of the substrate and includes both $sp^2$ bonded carbon and $sp^3$ bonded carbon. The carbon transfer layer preferably has a ratio $sp^3/(sp^2+sp^3)$ of the $sp^3$ bonded carbon to the totality of the $sp^2$ bonded carbon and the $sp^3$ bonded carbon of 0.1 or more.

16 Claims, 6 Drawing Sheets

(51) Int. Cl.
| | |
|---|---|
| *C23C 26/00* | (2006.01) |
| *F16C 29/02* | (2006.01) |
| *C23C 28/04* | (2006.01) |
| *C23C 24/02* | (2006.01) |
| *C23C 14/06* | (2006.01) |
| *F16J 9/26* | (2006.01) |
| *C01B 32/05* | (2017.01) |
| *C23C 14/32* | (2006.01) |
| *F16C 29/04* | (2006.01) |
| *F16C 29/00* | (2006.01) |
| *C01B 32/20* | (2017.01) |
| *C01B 32/25* | (2017.01) |
| *C10M 103/02* | (2006.01) |

(52) U.S. Cl.
CPC .......... *C23C 14/0611* (2013.01); *C23C 14/32* (2013.01); *C23C 16/26* (2013.01); *C23C 24/02* (2013.01); *C23C 26/00* (2013.01); *C23C 28/04* (2013.01); *C23C 28/042* (2013.01); *C23C 28/046* (2013.01); *F16C 29/02* (2013.01); *F16J 9/26* (2013.01); *C01B 32/20* (2017.08); *C01B 32/25* (2017.08); *C01P 2004/00* (2013.01); *C10M 103/02* (2013.01); *C10M 2201/041* (2013.01); *F16C 29/00* (2013.01); *F16C 29/04* (2013.01); *F16C 2206/02* (2013.01)

(58) Field of Classification Search
USPC .................................................. 428/336, 408
See application file for complete search history.

(56) References Cited

U.S. PATENT DOCUMENTS

| | | | |
|---|---|---|---|
| 2015/0358578 A1* | 12/2015 | Lee ......................... | H04N 7/141 |
| | | | 348/14.01 |
| 2016/0153083 A1* | 6/2016 | Leson ............... | H01J 37/32339 |
| | | | 428/408 |
| 2017/0167608 A1* | 6/2017 | Ooshiro .................. | C23C 16/50 |
| 2017/0362711 A1 | 12/2017 | Kato | |
| 2018/0023016 A1 | 1/2018 | Kato | |

FOREIGN PATENT DOCUMENTS

| | | |
|---|---|---|
| JP | 2016-145417 A | 8/2016 |
| JP | 2017-155896 A | 9/2017 |

\* cited by examiner

[FIG. 1]
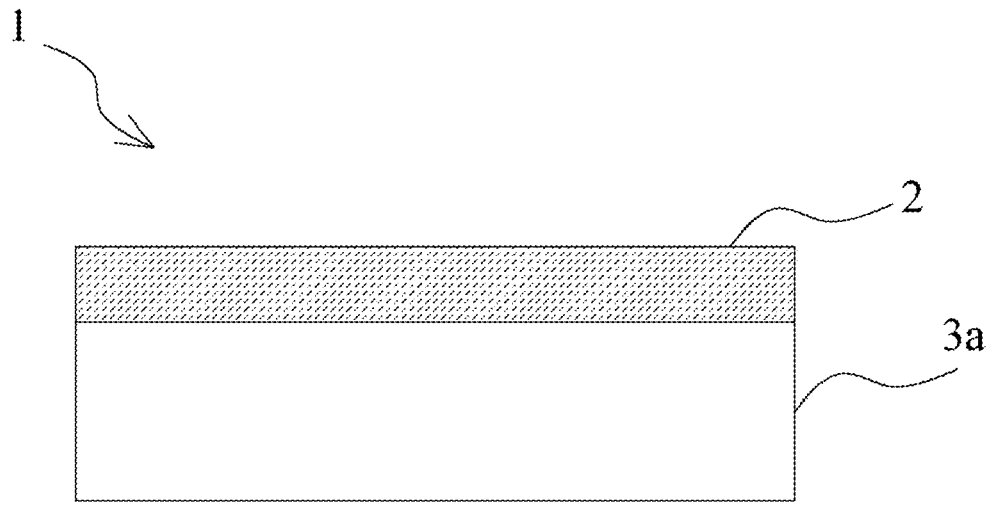
[FIG. 2A]
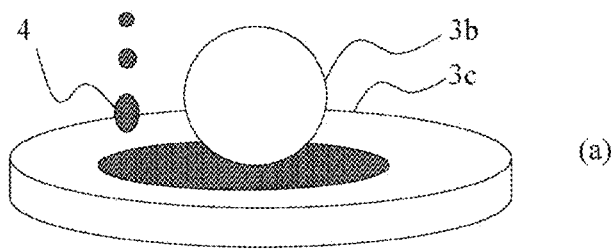
(a)
[FIG. 2B]
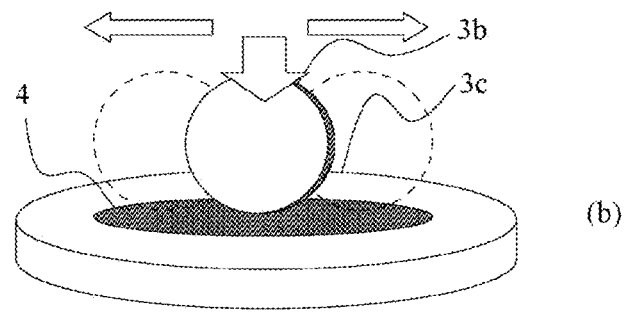
(b)

[FIG. 2C]
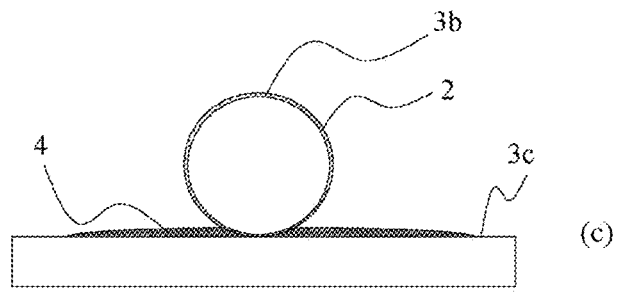
(c)
[FIG. 3]
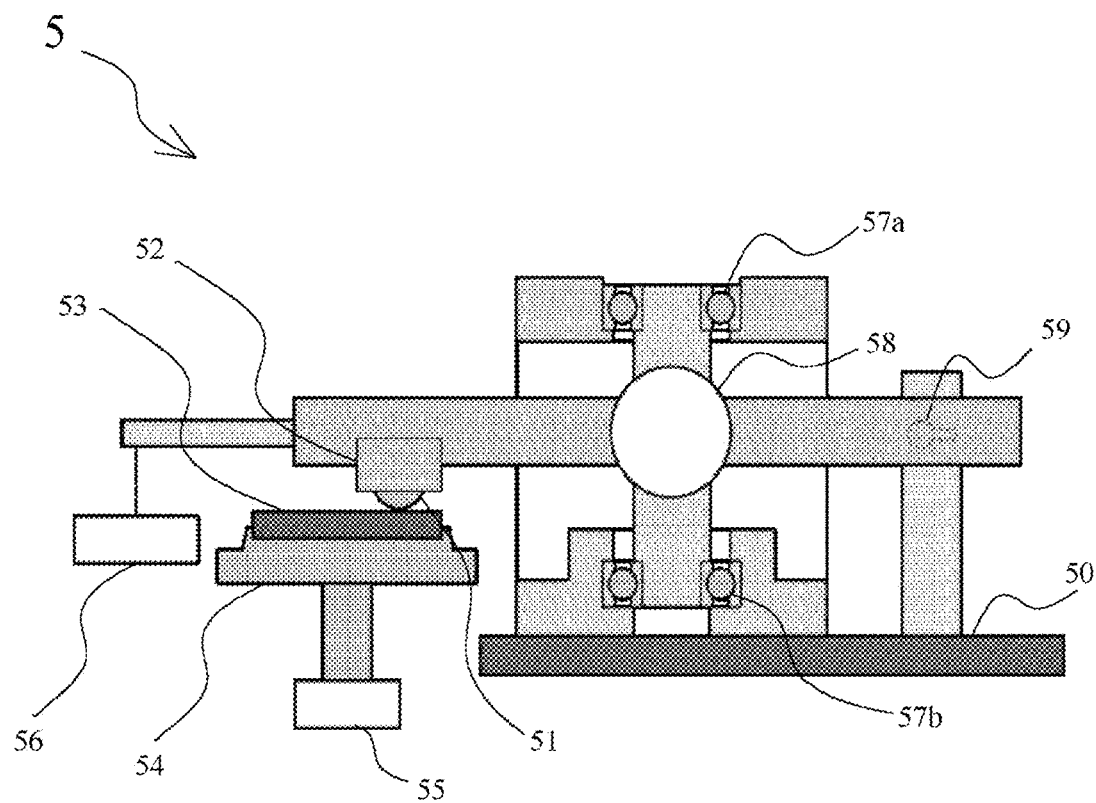

[FIG. 4]
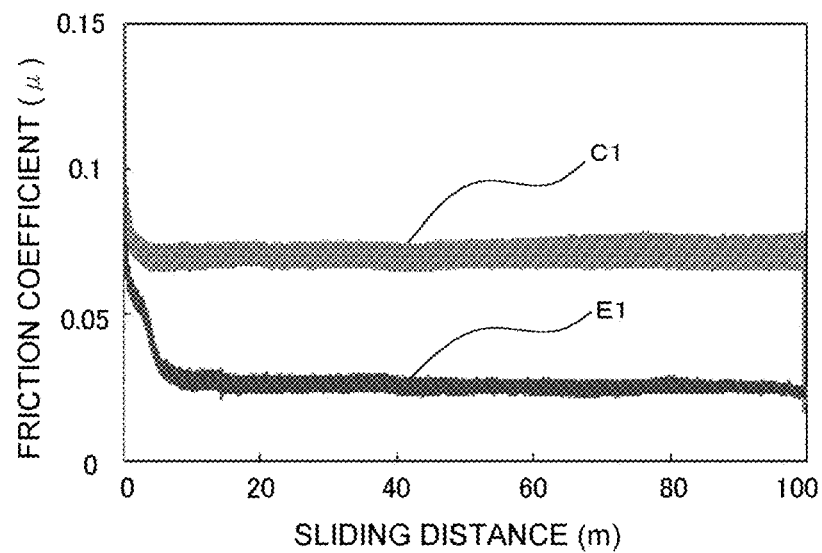
[FIG. 5]
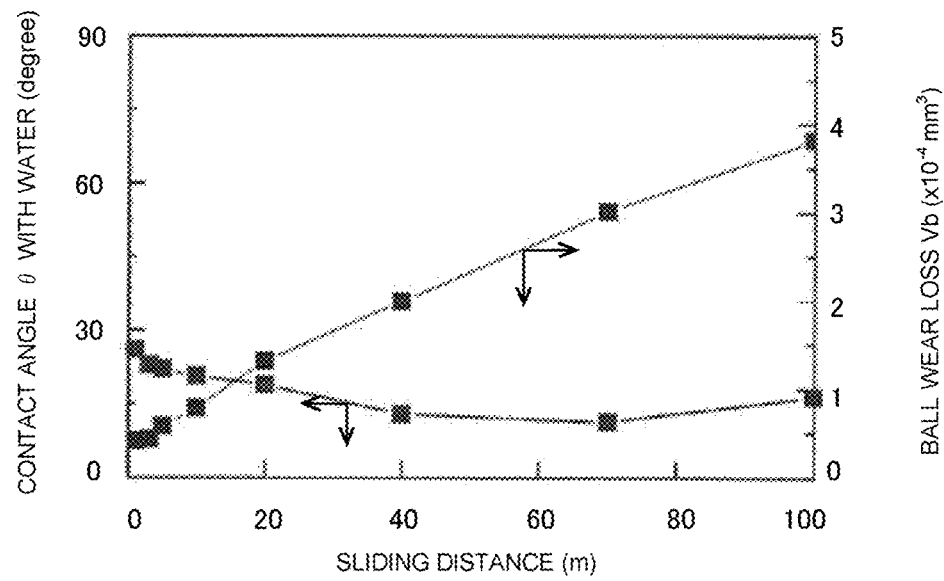

[FIG. 6]
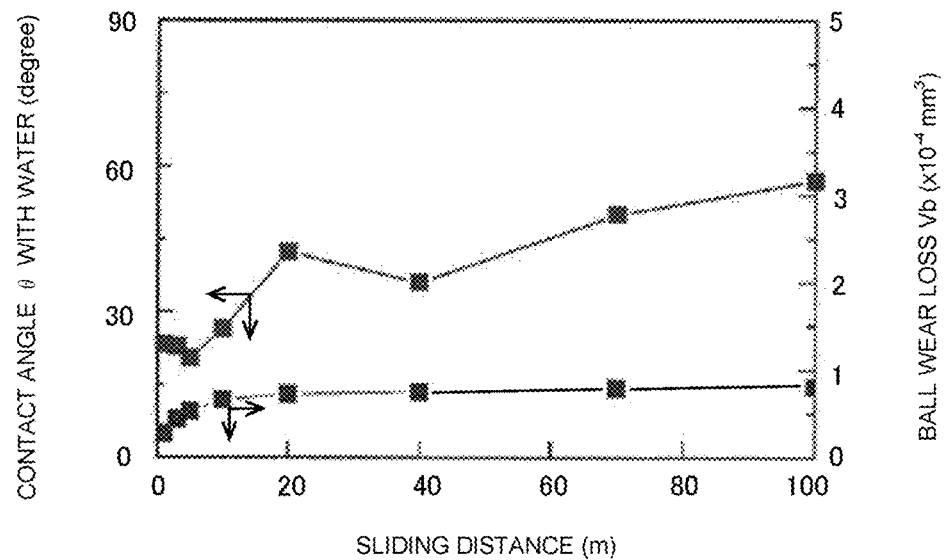
[FIG. 7]
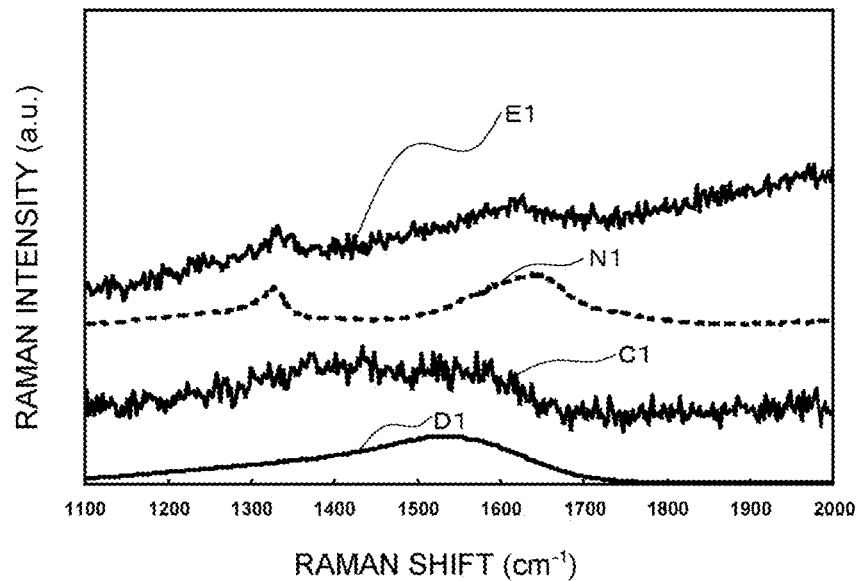

[FIG. 8]
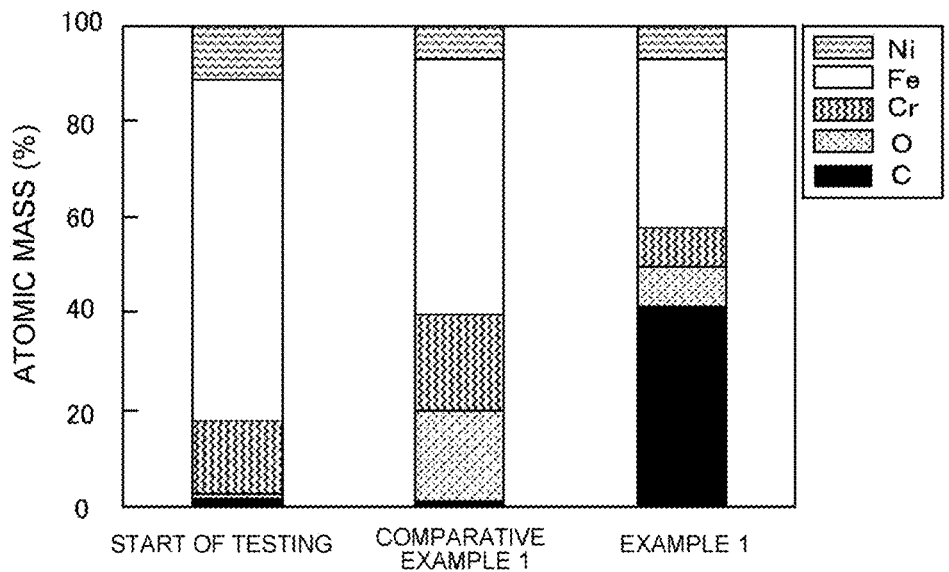
[FIG. 9]
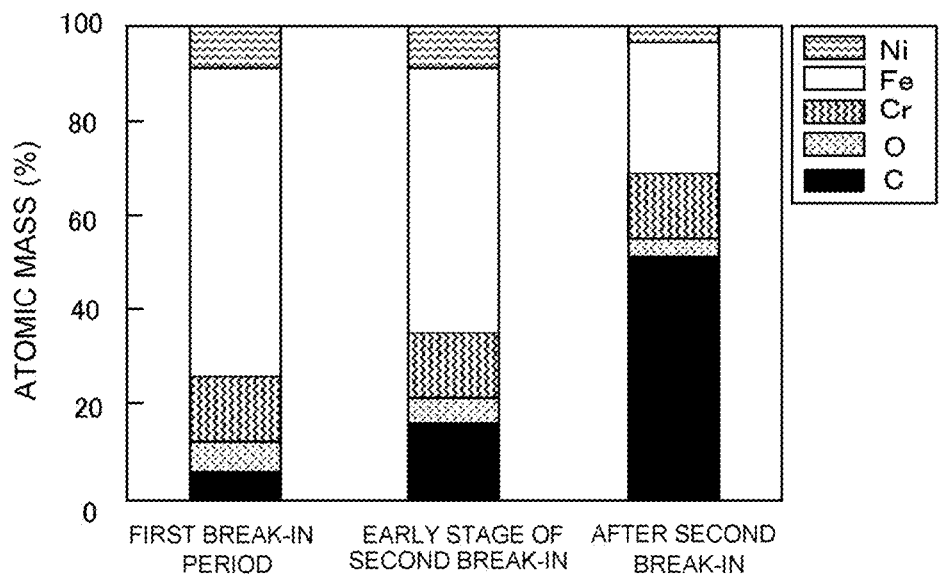
[FIG. 10A]
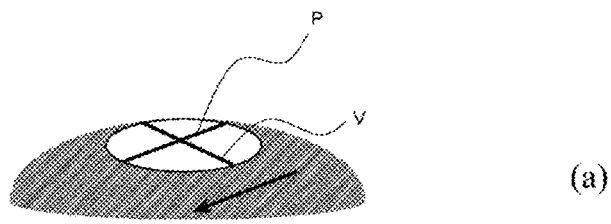
(a)

[FIG. 10B]
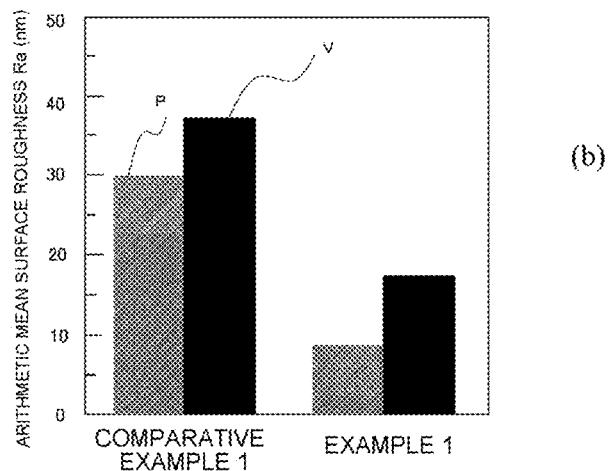
(b)
[FIG. 11]
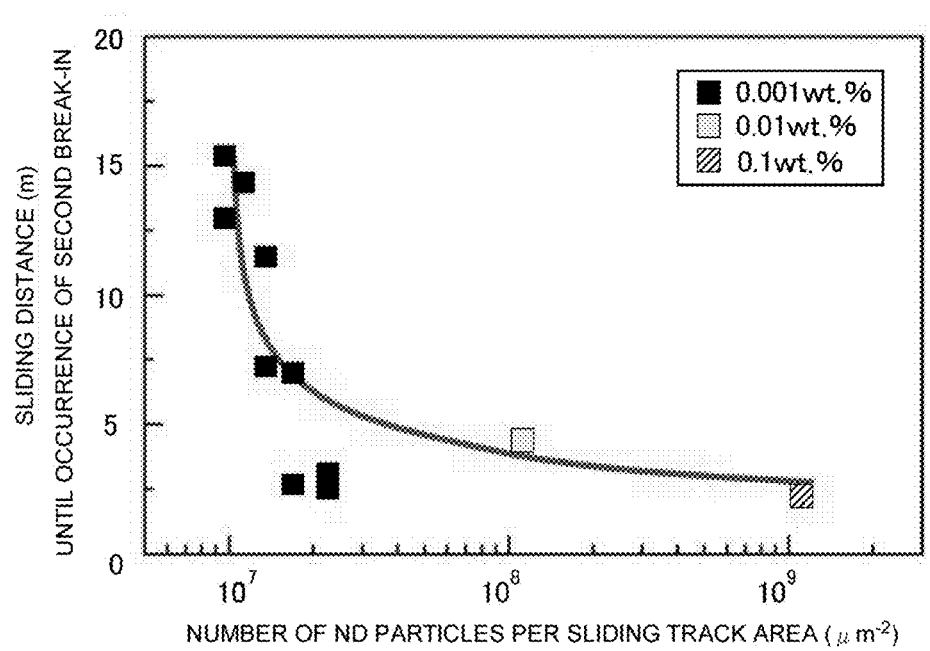

SLIDING MEMBER WITH CARBON TRANSFER LAYER

TECHNICAL FIELD

The present invention relates to sliding members with carbon transfer layers (carbon-transfer-layered sliding members). This application claims priority to Japanese Patent Application No. 2018-209298, filed Nov. 6, 2018 in Japan, the entire contents of which are incorporated herein by reference.

BACKGROUND ART

Sliding members, which are members having a sliding surface, are now widely used as materials for products in various fields, such as automobiles, machinery parts, medical devices, and household electrical appliances.

As a technique for better tribological properties of such a sliding member, surface modification technology gathers attention. Non Patent Literature (NPL) 1 mentions that a graphene oxide aqueous dispersion (graphene oxide concentration: 1 mass percent), when present between, during sliding, friction surfaces of a special use stainless steel (SUS) 304 substrate and a superhard bearing ball, forms a tribofilm on the SUS 304 substrate to reduce the friction coefficient.

CITATION LIST

Non Patent Literature

NPL 1: Kinoshita H. and Nishina Y., Elucidation of Friction Mechanism of Graphene Oxide Lubricant Additive (in Japanese), Proceedings of Tribology Conference 2015 Spring Himeji, C5 (2015) pp. 163-164

SUMMARY OF INVENTION

Technical Problem

Unfortunately, NPL 1 mentions that the tribofilm fails to adhere to the friction surface, is unstuck at edges, and, actually, remains only in a part of the friction surface. Disadvantageously, such a sliding member bearing the tribofilm undergoes progress of separation and/or loss of the tribofilm from edges and fails to satisfactorily effectively decrease friction and reduce wear.

The present invention has been made under these circumstances and has an object to provide a sliding member that has a carbon transfer layer and is effective for decreasing friction and reducing wear, and a method for producing the sliding member.

Solution to Problem

After intensive investigations to achieve the object, the inventors of the present invention have found that a sliding member including a substrate and, on the surface thereof, a carbon transfer layer including both $sp^2$ bonded carbon and $sp^3$ bonded carbon (hereinafter also simply referred to as a "carbon-transfer-layered sliding member according to the embodiment of the present invention") can significantly effectively decrease friction and reduce wear. The present invention has been made on the basis of these findings.

Specifically, an aspect of the present invention provides a sliding member including a substrate and a carbon transfer layer (carbon-transfer-layered sliding member). The carbon transfer layer is disposed on a surface of the substrate and includes $sp^2$ bonded carbon and $sp^3$ bonded carbon.

The carbon transfer layer preferably has a ratio $spa/(sp^2+sp^3)$ of the $sp^3$ bonded carbon to the totality of the $sp^2$ bonded carbon and the $sp^3$ bonded carbon of 0.1 or more.

The carbon transfer layer preferably gives a G band appearing at 1570 to 1640 $cm^{-1}$ and a D band appearing at 1300 to 1400 $cm^{-1}$ in a Raman spectrum obtained by Raman spectroscopic analysis using a 532-nm measurement light source.

The carbon transfer layer preferably has a thickness (layer thickness) of 100 to 1000 nm.

Another aspect of the present invention provides a method for producing a sliding member having a carbon transfer layer by relatively sliding a first member and a second member through a carbonaceous lubricating material. The method includes a lubricating material application step and a transfer layer formation step. The lubricating material application step applies the carbonaceous lubricating material to space between a sliding surface of the first member and a sliding surface of the second member. The transfer layer formation step relatively slides the sliding surface of the first member and the sliding surface of the second member to transfer carbon derived from the second member onto the surface of the first member and whereby forms a carbon transfer layer on the first member surface. Hereinafter this method is also simply referred to as a "method according to the embodiment of the present invention for producing a carbon-transfer-layered sliding member".

The carbonaceous lubricating material preferably includes a nanodiamond particle.

The first member is preferably made of a metal.

The second member preferably has a diamond-like carbon film at the sliding surface against the first member.

The method according to the embodiment of the present invention for producing a carbon-transfer-layered sliding member may preform the lubricating material application step and the transfer layer formation step each under a boundary lubrication condition.

Advantageous Effects of Invention

The carbon-transfer-layered sliding member according to the embodiment of the present invention includes the carbon transfer layer, which includes both $sp^2$ bonded carbon and spa bonded carbon and is disposed on the surface of the substrate, and can very effectively decrease friction and reduce wear. The method according to the embodiment of the present invention for producing a carbon-transfer-layered sliding member can produce a sliding member that can very effectively decrease friction and reduce wear.

BRIEF DESCRIPTION OF DRAWINGS

FIG. 1 is a schematic enlarged view of a carbon-transfer-layered sliding member according to an embodiment of the present invention;

FIG. 2A is an explanatory drawing illustrating an exemplary lubricating material application step in a carbon-transfer-layered sliding member production method according to an embodiment of the present invention;

FIG. 2B is an explanatory drawing illustrating an exemplary transfer layer formation step in the method according to the embodiment of the present invention for producing a carbon-transfer-layered sliding member;

FIG. 2C is an explanatory drawing illustrating the transfer layer formation step in the method according to the embodiment of the present invention for producing a carbon-transfer-layered sliding member;

FIG. 3 is a schematic view of a lubricant-dropping ball-on-disk tribo-tester;

FIG. 4 is a graph illustrating how the friction coefficient varies depending on the sliding distance from the start to the end of testing;

FIG. 5 is a graph illustrating how the wear loss and the contact angle with water vary depending on the sliding distance in Example 1;

FIG. 6 is a graph illustrating how the wear loss and the contact angle with water vary depending on the sliding distance in Comparative Example 1;

FIG. 7 depicts Raman spectra of the sliding member of Example 1, the sliding member of Comparative Example 1, a diamond-like carbon (DLC) disk at the start of testing, and nanodiamond particles at the start of testing.

FIG. 8 is a graph illustrating energy dispersive spectroscopic (EDS) analysis results of SUS 304 ball wear track surfaces in Example 1 and Comparative Example 1 at the end of testing;

FIG. 9 is a graph illustrating EDS analysis results of SUS 304 ball wear track surfaces in Example 1, in a first break-in period, at an initial stage of a second break-in, and after break-in;

FIG. 10A is an explanatory drawing illustrating directions (P: parallel; V: vertical) with respect to the sliding direction in the graph of FIG. 10B illustrating the arithmetic mean surface roughness (Ra) in Example 1 and Comparative Example 1;

FIG. 10B is a graph of the arithmetic mean surface roughness (Ra) in Example 1 and Comparative Example 1, where Ra is indicated individually in each direction (P: parallel; V: vertical) with respect to the sliding direction; and FIG. 11 is a graph illustrating, in Examples 1 to 3, how the number of ND particles per unit area of a sliding track on the DLC disk varies depending on the sliding distance (sliding length) until the occurrence of the second break-in.

DESCRIPTION OF EMBODIMENTS

Sliding Member with Carbon Transfer Layer

The present invention will be illustrated in detail below, with reference to the attached drawings. FIG. 1 is a schematic enlarged view of a carbon-transfer-layered sliding member 1 according to an embodiment of the present invention, in which a carbon transfer layer 2 is disposed on a substrate 3a. The carbon-transfer-layered sliding member 1 according to the embodiment of the present invention includes the substrate 3a and the carbon transfer layer 2, where the carbon transfer layer 2 is disposed on the surface of the substrate 3a and includes both $sp^2$ bonded carbon and spa bonded carbon.

Substrate

The substrate 3a may be made of any material. Non-limiting examples of such materials include metal materials exemplified by alloy steels such as carbon steels, chromium steels, and chromium-molybdenum steels; and special use steels such as alloy tool steels, stainless steels (such as special use stainless steels (SUSs)), bearing steels (such as high carbon-chromium bearing steels (SUJs)), spring steels (such as spring steels of SUP grades). The substrate may bear a diamond-like carbon (DLC) film at its surface and may have undergone any of various surface treatments. Non-limiting examples of such surface treatments include electrochemical treatments such as plating, chemical conversion treatment, and anodization; coating or painting treatments such as fluid coating (liquid coating) and powder coating; and physical surface treatments such as shot blasting.

Of such substrate materials, preferred are stainless steels. These materials have high strength and high toughness, offer excellent corrosion resistance, and are useful as water-lubricated friction materials. The substrate is preferably a substrate coated with a DLC film, for still retarded wear and decreased friction of the sliding portion.

Carbon Transfer Layer

The carbon transfer layer 2 is disposed on the surface of the substrate 3a. As used herein, the term "surface" refers to a sliding surface in a movable element of a variety of sliding members. Also as used herein, the term "transfer layer" is a concept including a film or layer that is formed by wear powder (also called "transfer particle") derived from at least one of two mutually sliding members and being deposited on the surface of the other member; and a film (so-called tribofilm) resulting from adsorption by the sliding surface, or chemical reaction, of an additive in a lubricating material and/or a wear powder.

Specifically, the carbon transfer layer 2 is made of the tribofilm and/or a film or layer formed by the wear powder containing carbon.

The carbon transfer layer 2 includes both $sp^2$ bonded carbon and $sp^3$ bonded carbon. Specifically, the carbon transfer layer 2 includes a mixture of $sp^2$ bonded carbon corresponding to a graphite structure, and $sp^3$ bonded carbon corresponding to a diamond structure.

The carbon transfer layer 2 may have any ratio $sp^3/(sp^2+sp^3)$, but the ratio is preferably 0.1 or more, more preferably 0.3 or more, and particularly preferably 0.5 or more, where the ratio $spa/(sp^2+sp^3)$ is the ratio of the $sp^3$ bonded carbon to the totality of the $sp^2$ bonded carbon and the $sp^3$ bonded carbon. The carbon transfer layer, when having a ratio $sp^3/(sp^2+sp^3)$ of 0.1 or more, still more contributes to lower wear. The ratio is preferably less than 0.98, more preferably 0.95 or less, and particularly preferably 0.9 or less. The carbon transfer layer, if having a ratio $sp^3/(sp^2+sp^3)$ of 0.98 or more, may enhance abrasion by the $sp^3$ bonded carbon, and may lose its wear reduction function.

The ratio $sp^3/(sp^2+sp^3)$, which is the ratio of the $sp^3$ bonded carbon to the totality of the $sp^2$ bonded carbon and the $sp^3$ bonded carbon, can be evaluated using a Raman spectrum obtained by Raman spectroscopic analysis. Such a Raman spectrum, when used for the evaluation of a carbon material, is generally interpreted to include two peaks, i.e., a disorder band (D band) and a graphite band (G band), and the evaluation is performed typically by separating the two bands, determining the ratio of the peak intensity of the D band to the peak intensity of the G band, and taking this ratio as an index (see, for example, Japanese Unexamined Patent Application Publication (JP-A) No. 2008-116268).

Specifically, the ratio $sp^3/(sp^2+sp^3)$, which is the ratio of the spa bonded carbon to the totality of the $sp^2$ bonded carbon and the spa bonded carbon, can be determined using an index, i.e., a ratio $Id/(Id+Ig)$, which is the ratio of the D band peak integrated intensity (Id) to the totality of the D band peak integrated intensity (Id) and the G band peak integrated intensity (Ig). In such a Raman spectrum obtained by Raman spectroscopic analysis, the D band peak appears at a wavenumber from 1300 to 1400 cm$^{-1}$ and is hereinafter also referred to as a "D peak"; and the G band peak appears at a wavenumber from 1570 to 1640 cm$^{-1}$ and is hereinafter also referred to as "G peak". The determination is possible because the ratio $sp^3/(sp^2+sp^3)$ and the ratio $Id/(Id+Ig)$ are considered to correlate with each other.

The Raman spectrum can be determined typically under the following conditions:

Measuring instrument: Laser Raman spectrophotometer NRS-5100 (trade name, JASCO Corporation)
Measurement light source: 532 nm
Output: 0.8 mW
Slit width: 100 by 1000 mm
Exposure time: 10 sec.
Number of scans: 4

The carbon transfer layer 2, when giving a Raman spectrum through Raman spectroscopic analysis using a 532-nm measurement light source, gives a G band appearing at a wavenumber from 1570 to 1640 $cm^{-1}$ and a D band appearing at a wavenumber from 1300 to 1400 $cm^{-1}$.

The G band of the carbon transfer layer 2 appears preferably at 1580 to 1640 $cm^{-1}$, more preferably at 1590 to 1630 $cm^{-1}$, and particularly preferably at 1600 to 1620 $cm^{-1}$.

In a common knowledge relating to G bands of carbon materials, DLC gives a G band at around 1550 $cm^{-1}$, and a nanodiamond gives a G band at around 1650 $cm^{-1}$.

Surprisingly, the inventors have found that the G band of the carbon transfer layer 2 has a peak intensity that apparently differs in position from the peak intensities of the G bands of DLC and the nanodiamond and stands midway between the two peak intensities in position.

The inventors have also found that the carbon transfer layer 2 has a G band peak intensity higher than a D band peak intensity. Specifically, the inventors have found that the carbon transfer layer 2 gives a Raman spectrum that has a baseline rising from left to right. A known carbonaceous material that has a Raman spectrum baseline rising from left to right is a polymer-like carbon (PLC). The inventors have determined that the carbon transfer layer 2 approximates to PLC in Raman spectral waveform.

Thus, the carbon transfer layer 2 is probably a carbon transfer layer that has a Raman spectral waveform like PLC and is formed from nanodiamond-derived $sp^3$ bonded carbon and/or DLC-derived $sp^3$ bonded carbon, although the exact mechanism of this remains unknown. This configuration probably somewhat affects the development of the friction decreasing effect and/or the wear reducing effect.

The carbon transfer layer 2 includes, as constrictive atoms, at least carbon and iron and may further include any of other atoms such as oxygen, chromium, and nickel. The carbon transfer layer 2 preferably contains carbon atoms in a higher content than the content of iron atoms, to still more effectively decrease friction and reduce wear. The contents of atoms constituting the carbon transfer layer 2 can be measured typically by energy dispersive X-ray spectroscopy (EDS) under conditions below.

The EDS measuring conditions are typically as follows:
Measuring instrument: Energy dispersive X-ray spectroscopic analyzer X-Max50 (trade name, OXFORD instruments)
Acceleration voltage: 5 kV The carbon transfer layer 2 may have any carbon content, but the content is preferably 20 atom mass percent or more, more preferably 30 atom mass percent or more, and particularly preferably 40 atom mass percent or more. The carbon transfer layer 2, when having a carbon content of 20 atom mass percent or more, can more functionally advantageously decrease friction. The atomic mass percentage of carbon can be measured by the EDS.

The carbon transfer layer 2 may have any thickness (layer thickness), but the thickness is preferably 100 to 1000 nm, more preferably 200 to 800 nm, and particularly preferably 300 to 600 nm, to combine wear reduction function, low-friction properties, adhesion strength, and durability.

The carbon transfer layer 2 may have any hardness, and the hardness is appropriately adjusted so as to be a necessary hardness according to the material and hardness of the counter member, and according to the intended use. The hardness of the carbon transfer layer 2 can be controlled by regulating the ratio $spa/(sp^2+sp^3)$, which is the ratio of the $sp^3$ bonded carbon to the totality of the $sp^2$ bonded carbon and the $sp^3$ bonded carbon. The ratio $spa/(sp^2+sp^3)$ can be controlled in turn by the composition of a carbon-containing (carbonaceous) lubricating material 4 described later. The hardness of the carbon transfer layer 2 can be measured by any technique such as a nanoindentation technique.

The carbon transfer layer 2 may have any surface roughness, but the surface roughness is preferably 50 nm or less, more preferably 40 nm or less, and particularly preferably 30 nm or less, in terms of arithmetic mean surface roughness (Ra) determined according to JIS B 0601:2013. The carbon transfer layer 2, when having an arithmetic mean surface roughness of 50 nm or less, has an extremely smooth surface and can still more effectively decrease friction and reduce wear.

The carbon transfer layer 2 may have any contact angle with water, but the contact angle with water is preferably 30° or more, more preferably 40° or more, and particularly preferably 50° or more. With an increasing contact angle with water, the carbon transfer layer 2 has a tendency to have lower wettability. This is probably because the carbon transfer layer, when having an extremely smooth surface, affects the surface tension of water, although the exact mechanism of this remains unknown. The contact angle can be measured typically using a contact angle meter such as Micro Contact Angle Meter MCA-3 (trade name, Kyowa Interface Science Co., Ltd.).

The carbon transfer layer 2 preferably has a lower surface friction coefficient, to effectively decrease friction and reduce wear. The friction coefficient is, for example, 0.05 or less. The carbon transfer layer 2, when having a surface friction coefficient of 0.05 or less, can more effectively decrease friction.

The surface friction coefficient of the carbon transfer layer 2 may be measured by any technique or test, which can be selected appropriately typically from rotating ball (pin)-on-disk tests, reciprocating ball (pin)-on-disk tests, thrust cylinder tests, block-on-ring tests, four-ball tests, and pin-block tests, according to the purpose or intended use of the carbon-transfer-layered sliding member 1 according to the embodiment of the present invention.

For example, the surface friction coefficient of the carbon transfer layer 2 may be determined by a friction test using a lubricant-dropping ball-on-disk tribo-tester (sliding friction tester) as follows.

Friction test: A ball-on-disk tribo-tester to be used includes a SUJ2 disk, a SUS 304 ball, and a load cell. The SUJ2 disk has, at its surface, a DLC sliding surface and has a diameter of 30 mm and a thickness of 4 mm. The SUS 304 ball bears a carbon transfer layer and has a diameter of 8 mm. The ball slides over the DLC sliding surface of the disk under a load of 10 N at a speed of 10 mm/s; during the sliding, the friction force between the disk and the ball is measured using the load cell; and the friction force is divided by the load to give the friction coefficient.

Carbonaceous Lubricating Material

As used herein, the term "carbonaceous lubricating material" is a concept including both an initial break-in agent for the formation, at the sliding surface, of a break-in face (low friction face) suitable for sliding; and a common lubricant used for reducing friction and wear. The carbonaceous lubricating material 4 includes a lubrication vehicle and an additive that contains carbon and imparts various lubricative properties such as wear resistance and friction decreasing capability.

Examples of the additive include, but are not limited to, hard carbon particles (DLC particles) and diamond particles. Among them, the additive is preferably diamond particles, to form a carbon transfer layer effective for decreasing friction and reducing wear.

The diamond particles may be any diamond particles such as natural diamond particles and synthetic diamond particles, but are preferably nanodiamond particles (hereinafter also referred to as "ND particles").

ND Particles

The ND particles for use herein may be any of known or common ND particles. The ND particles may be surface-modified ND particles whose surface is modified, or surface-unmodified ND particles, or a mixture of them. The surface-unmodified ND particles have hydroxy (—OH) groups at their surface. Each of different ND particles may be used alone or in combination.

To form the surface-modified ND particles, unmodified ND particles are surface-modified with a compound or a functional group. Non-limiting examples of the compound or functional group include silane compounds, carboxy group (—COOH), phosphonic acid ion or phosphonic acid residue, surface modification groups having terminal vinyl, amido group, cations of cationic surfactants, groups containing a polyglycerol chain, and groups containing a polyethylene glycol chain.

Examples of the lubrication vehicle include, but are not limited to, aqueous vehicles. As used herein, the term "aqueous" (vehicle) refers to water, or a solution mixture of water and a water-miscible organic solvent (such as an alcohol or glycerol).

The carbonaceous lubricating material 4 may contain the lubrication vehicle in any content, but the content is typically 99 mass percent or more, preferably 99.5 mass percent or more, more preferably 99.9 mass percent or more, and still more preferably 99.99 mass percent or more.

The carbonaceous lubricating material 4 may contain the ND particles in any content or concentration, but the content or concentration is typically 1.0 mass percent (10000 ppm by mass) or less, preferably 0.00005 to 0.5 mass percent, more preferably 0.0001 to 0.4 mass percent, furthermore preferably 0.0005 to 0.3 mass percent, and still more preferably 0.001 to 0.2 mass percent. The content of the ND particle is preferably 0.5 to 2000 ppm by mass. The carbonaceous lubricating material 4, when containing the ND particles in a content within the range, can advantageously efficiently lower friction while using the ND particles in such a small proportion.

In the carbonaceous lubricating material 4, the ND particles are apart from each other and dispersed as primary particles. The nanodiamond primary particles have a particle diameter of typically 10 nm or less, where the lower limit of the particle diameter is typically 1 nm. The ND particles in the carbonaceous lubricating material have a particle diameter D50 (median diameter) of typically 10 nm or less, preferably 9 nm or less, more preferably 8 nm or less, furthermore preferably 7 nm or less, and still more preferably 6 nm or less. The particle diameter D50 of the ND particles can be measured typically by a dynamic light scattering technique.

The ND particles contained in the carbonaceous lubricating material 4 are preferably detonation ND particles, which are ND particles formed by a detonation technique. The detonation technique can suitably form nanodiamonds having a particle diameter of primary particles of 10 nm or less.

The ND particles contained in the carbonaceous lubricating material 4 may be an oxygen oxidation product of detonation ND particles. The ND particles, when being the oxygen oxidation product, tend to give a peak assigned to C=O stretching vibration appearing at a position of 1750 $cm^{-1}$ or higher in Fourier transform infrared spectroscopy (FT-IR) and tend to have a negative zeta potential. The oxygen oxidation of detonation ND particles is as described in an oxygen oxidation step in the after-mentioned production process.

The ND particles contained in the carbonaceous lubricating material 4 may also be a hydrogen reduction product of detonation ND particles. The ND particles, when being the hydrogen reduction product, tend to give a peak assigned to C=O stretching vibration in FT-IR appearing at a position of lower than 1750 $cm^{-1}$ and tend to have a positive zeta potential. The hydrogen reduction of detonation ND particles is as described in a hydrogen reduction step in the production process.

The ND particles contained in the carbonaceous lubricating material 4, when having a negative, so-called zeta potential, have a zeta potential of typically −60 to −30 mV. For example, the ND particles can have a negative zeta potential by performing the oxygen oxidation in the production process at a relatively high temperature (e.g., 400° C. to 450° C.) as described later. The ND particles, when having a positive zeta potential, have a zeta potential of typically 30 to 60 mV. For example, the ND particles can have a positive zeta potential by performing the hydrogen reduction step subsequent to the oxygen oxidation step in the production process, as described later.

The carbonaceous lubricating material 4 may further contain one or more other components (other additives) in addition to the lubrication vehicle and the ND particles, as described above. Non-limiting examples of such other components include surfactants; thickeners; coupling agents; rust inhibitors for rust prevention or minimization of a metal member as a member to be lubricated; anticorrosive agents for corrosion retardation or depression of a nonmetal member as a member to be lubricated; freezing-point depressants; antifoaming agents; antiwear additives; antiseptic agents; coloring agents; and solid lubricating materials other than ND particles.

The carbonaceous lubricating material 4 as above can be produced by mixing a ND dispersion, which is obtained by the after-mentioned method, with a desired component such as water. The ND dispersion can be prepared through a process including a formation step S1, a purification step S2, an oxygen oxidation step S3, and a deaggregation step S4 as described below.

The formation step S1 forms nanodiamonds typically by the detonation technique. Specifically, initially, a shaped explosive equipped with an electric detonator is placed in a detonation pressure-tight chamber, and the chamber is hermetically sealed so that the explosive is coexistent with a predetermined gas. The chamber is made typically of iron and has a capacity of typically 0.5 to 40 $m^3$. A non-limiting example of the explosive usable herein is a mixture of trinitrotoluene (TNT) with cyclotrimethylenetrinitramine, namely, hexogen (RDX). The mixture may have a mass ratio (TNT:RDX) of TNT to RDX of typically from 40:60 to 60:40. The explosive is used in an amount of typically 0.05 to 2.0 kg. The gas to be hermetically sealed with the explosive in the chamber may have an atmospheric composition, or may be an inert gas. The gas is preferably an inert gas, to form nanodiamonds containing a smaller amount of surface functional groups in the primary particles. In other words, the detonation to form nanodiamonds is preferably performed in an inert gas atmosphere, to form nanodiamonds containing a smaller amount of surface functional groups in the primary particles. The inert gas for use herein may be at least one selected typically from nitrogen, argon, carbon dioxide, and helium.

Next, the formation step S1 ignites the electric detonator to detonate the explosive in the chamber. As used herein, the term "detonation" refers to, among explosions associated with chemical reactions, an explosion in which a flame front travels at a high speed faster than sound, where the reaction occurs at the flame front. In the detonation, the explosive partially undergoes incomplete combustion to liberate carbon, and the liberated carbon serves as a starting material to form nanodiamonds by the action of pressure and energy of a shock wave generated by the explosion. The detonation technique enables formation of nanodiamonds having a particle diameter of primary particles of 10 nm or less, as described above. In the formation of such nanodiamond products by the detonation technique, initially, primary particles aggregate to form agglutinates, by very strong interactions between adjacent primary particles or crystallites, namely, by the actions of not only van der Waals force, but also Coulomb interaction between crystal faces.

The formation step S1 then cools the chamber and the contents thereof by leaving them stand at room temperature typically for 24 hours. After the natural cooling, a nanodiamond crude product is recovered. The nanodiamond crude product can be recovered typically by scrapping off and collecting, using a spatula, a nanodiamond crude product (including nanodiamond particle agglutinates formed in the above manner, and soot) attached to the chamber inner wall. The detonation technique as above can give a crude product of nanodiamond particles. The formation step S1 as above, when repeatedly performed in a necessary number of times, can give a desired amount of the nanodiamond crude product.

The purification step S2, in the embodiment, includes an acid treatment that causes, for example, a strong acid to act upon the material nanodiamond crude product in an water medium. The detonation nanodiamond crude product often includes metal oxides which are oxides typically of Fe, Co, and Ni derived from, for example, the chamber used in the detonation. The metal oxides can be dissolved off, and removed from the nanodiamond crude product typically by applying a predetermined strong acid to the crude product in a water medium (acid treatment). The strong acid for use in the acid treatment is preferably selected from mineral acids such as hydrochloric acid, hydrofluoric acid, sulfuric acid, nitric acid, and aqua regia. The acid treatment may employ each of different strong acids alone or in combination. The acid treatment may employ the strong acid(s) in a concentration of typically 1 to 50 mass percent. The acid treatment is performed at a temperature of typically 70° C. to 150° C. for a time of typically 0.1 to 24 hours. The acid treatment can be performed under reduced pressure, at normal atmospheric pressure, or under pressure (under a load). After the acid treatment as above, the solids (including nanodiamond agglutinates) are washed with water typically by decantation. The water washing of the solids by decantation is preferably repeated until the pH of a sedimentary solution reaches, for example, 2 to 3. When the detonation nanodiamond crude product has a low metal oxide content, the acid treatment as above may be omitted.

The purification step S2, in the embodiment, includes a solution oxidation to remove non-diamond carbon such as graphite and amorphous carbon from the nanodiamond crude product (nanodiamond agglutinates before the completion of purification) using an oxidizer. Such a detonation nanodiamond crude product includes non-diamond carbon such as graphite and amorphous carbon. The non-diamond carbon is derived from carbon that has failed to form nanodiamond crystals, among carbons liberated from the explosive as a result of partial incomplete combustion. The non-diamond carbon can be removed from the nanodiamond crude product typically by allowing a predetermined oxidizer to act upon the crude product after the acid treatment in a water medium (solution oxidation). Non-limiting examples of the oxidizer for use in the solution oxidation include chromic acid, chromic anhydride, dichromic acid, permanganic acid, perchloric acid, and salts of these acids, nitric acid, and mixed acid (mixture of sulfuric acid and nitric acid). The solution oxidation may employ each of different oxidizers alone or in combination. The solution oxidation may use the oxidizer(s) in a concentration of typically 3 to 50 mass percent. The solution oxidation may use the oxidizer(s) in an amount of typically 300 to 2000 parts by mass per 100 parts by mass of the nanodiamond crude product to undergo the solution oxidation. The solution oxidation is performed at a temperature of typically 50° C. to 250° C. for a time of typically 1 to 72 hours. The solution oxidation can be performed under reduced pressure, at normal atmospheric pressure, or under pressure (under a load). After the solution oxidation as above, the solids (including nanodiamond agglutinates) are washed with water typically by decantation. A supernatant at an early stage of the water washing is colored. The water washing of the solids by decantation is preferably repeated until the supernatant becomes visually transparent.

A supernatant is removed from the nanodiamond-containing fluid resulting from the treatment, and a residual fraction undergoes a drying treatment to give a dry powder. Examples of the way for the drying treatment includes spray drying using a spray dryer, and evaporation to dryness on an evaporator.

The subsequent oxygen oxidation step S3 heats the nanodiamond powder, which is obtained through the purification step S2, using a gas atmosphere furnace in an atmosphere of an oxygen-containing gas having a predetermined composition. Specifically, the nanodiamond powder is placed in the gas atmosphere furnace, to which the oxygen-containing gas is fed, and the internal temperature of the furnace is raised up to a temperature set as a heating temperature, to perform the oxygen oxidation. The oxygen oxidation is performed at a temperature of typically 250° C. to 500° C. To allow ND particles in the resulting ND dispersion to have a negative zeta potential, the oxygen oxidation is preferably performed at a relatively high temperature of, for example, 400° C. to 450° C. The oxygen-containing gas for use in the embodiment is a gaseous mixture containing not only oxygen, but also an inert gas. Non-limiting examples of the inert gas include nitrogen, argon, carbon dioxide, and helium. The gaseous mixture has an oxygen concentration of typically 1 to 35 volume percent.

To allow ND particles in the ND dispersion to have a positive zeta potential, a hydrogen reduction step S3' is preferably performed after the oxygen oxidation step S3. The hydrogen reduction step S3' heats the nanodiamond powder, which is obtained through the oxygen oxidation step S3, using a gas atmosphere furnace in a hydrogen-containing gas atmosphere having a predetermined composition. Specifically, the nanodiamond powder is placed in the gas atmosphere furnace, a hydrogen-containing gas is fed to or passed through the furnace, and the internal temperature of the furnace is raised to a temperature set as a heating temperature, to perform the hydrogen reduction. The hydrogen reduction is performed at a temperature of typically 400° C. to 800° C. The hydrogen-containing gas for use in the embodiment is a gaseous mixture containing not only hydrogen, but also an inert gas. Non-limiting examples of the inert gas include nitrogen, argon, carbon dioxide, and helium. The gaseous mixture has a hydrogen concentration of typically 1 to 50 volume percent. To allow ND particles contained in the resulting ND dispersion to have a negative zeta potential, a deaggregation step S4 mentioned below may be performed without the hydrogen reduction step as above.

After being purified or treated through the process as above, the detonation nanodiamonds may be present in the form of agglutinates (secondary particles). To separate the agglutinates into primary particles, a deaggregation step S4 is performed subsequently. Specifically, the nanodiamonds undergone the oxygen oxidation step S3 or the subsequent hydrogen reduction step S3' are suspended in pure water to give a slurry (nanodiamond suspension) containing nanodiamonds. Upon preparation of the slurry, the nanodiamond suspension may undergo centrifugation or ultrasonication to remove relatively big assemblies from the nanodiamond suspension. The slurry then undergoes a wet deaggregation treatment. The deaggregation treatment can be performed using a device selected typically from high-shear mixers, homomixers, ball mills, bead mills, high-pressure homogenizers, ultrasonic homogenizers, and colloid mills, or any combination of them. The device is preferably such a bead mill, for good efficiency.

The bead mill, which works as a pulverizer or disperser, typically includes a cylindrical mill chamber, a rotor pin, a centrifugal mechanism, a material tank, and a pump. The rotor pin has a shaft center common with the mill chamber and is configured to be rotatable at high speed in the mill chamber. The centrifugal mechanism is disposed in an upper part in the mill chamber. The deaggregation step performs bead milling using the bead mill, in which a predetermined amount of beads is charged into the mill chamber, the rotor pin stirs the beads, and in this state, the pump feeds the slurry (including nanodiamond agglutinates) as a material from the material tank to a lower portion of the mill chamber. The slurry passes through space between the beads stirred at high speed in the mill chamber and reaches the upper part of the mill chamber. During this process, the vigorously moving beads come in contact with, and pulverize or disperse the nanodiamond agglutinates in the slurry. This promotes deaggregation from nanodiamond agglutinates (secondary particles) to primary particles. The slurry and the beads, when reaching the centrifugal mechanism in the upper portion of the mill chamber, centrifugally separate from each other by the working of the centrifugal mechanism in operation, using the difference in specific gravity. Thus, the beads remain within the mill chamber, whereas the slurry leaves the mill chamber via a hollow line which is coupled slidably to the centrifugal mechanism. The discharged slurry returns to the material tank and then enters again the mill chamber by the working of the pump (cycle operation). In the bead milling as above, the beads used as a deaggregation medium are, for example, zirconia beads. The beads have a diameter of typically 15 to 500 μm. The beads are present in the mill chamber in an amount (apparent volume) of typically 50% to 80% relative to the volume of the mill chamber. The rotor pin rotates at a peripheral speed of typically 8 to 12 m/min. The slurry circulates in an amount of typically 200 to 600 mL at a flow rate of typically 5 to 15 L/hr. The treatment is performed for a time (cycle operation time) of typically 30 to 300 minutes. Instead of the continuous bead mill as above, a batch bead mill may also be used in the embodiment.

The deaggregation step S4 as above can give a ND dispersion containing nanodiamond primary particles. The dispersion resulting from the deaggregation step S4 may further undergo a classification operation to remove coarse particles. Such coarse particles can be removed from the dispersion typically with a classifier by a classification operation using centrifugation. This gives a ND dispersion, which is, for example, black, transparent and which includes nanodiamond primary particles dispersed as colloidal particles.

The carbonaceous lubricating material 4 includes the ND particles in any content or concentration, but the content or concentration is typically 1.0 mass percent (10000 ppm by mass) or less, preferably 0.00005 to 0.5 mass percent, more preferably 0.0001 to 0.4 mass percent, furthermore preferably 0.0005 to 0.3 mass percent, and still more preferably 0.001 to 0.2 mass percent, of the totality of the carbonaceous lubricating material. The carbonaceous lubricating material 4 is suitable for actually efficiently providing low friction with such a smaller proportion of ND particles to be blended with the lubrication vehicle. The reduction in proportion of the ND particles is preferred for reduction in production cost of the carbonaceous lubricating material.

Carbon-Transfer-Layered Sliding Member Production Method

A carbon-transfer-layered sliding member production method according to an embodiment of the present invention is a method for relatively sliding a first member and a second member through a carbonaceous lubricating material to produce the carbon-transfer-layered sliding member (sliding member having a carbon transfer layer). The method includes a lubricating material application step and a transfer layer formation step. The lubricating material application step applies the carbonaceous lubricating material to space between a sliding surface of the first member and a sliding surface of the second member. The transfer layer formation step relatively slides the sliding surface of the first member and the sliding surface of the second member to transfer carbon derived from the second member to the first member surface, and whereby forms a carbon transfer layer on the first member surface.

Lubricating Material Application Step

The lubricating material application step applies the carbonaceous lubricating material to space between the sliding surface of the first member and the sliding surface of the second member.

FIG. 2A illustrates the first member 3b and the second member 3c, which relatively slide. The carbonaceous lubricating material 4 for use herein may be an aqueous ND dispersion including ND particles dispersed in water (aqueous dispersion containing 0.001 mass percent of ND particles having surface carboxy groups). In this case, the first member 3b and the second member 3c may have identical or different hardness. The sliding members may have any shapes and dimensions, which can be selected appropriately from various shapes and dimensions according typically to the intended use.

In the illustrated embodiment, the first member 3b is a sphere, and the second member 3c is a disk. The first member 3b is made of a metal material such as SUS 304; and the second member 3c is made of a metal material such as SUJ2, whose surface, i.e., the sliding surface against the first member, bears a DLC film.

The metal material may be any metal material, which is exemplified typically by alloy steels such as carbon steels, chromium steels, and chromium-molybdenum steels; and special use steels including alloy tool steels, stainless steels (such as SUSs), bearing steels (such as SUJs), and spring steels (such as SUPs). The surfaces of the substrates (sliding members) may each be coated with a DLC film and may have undergone any of various surface treatments including electrochemical treatments such as plating, chemical conversion treatment, and anodization; coating or painting treatments such as fluid coating and powder coating; and physical surface treatments such as shot blasting.

Among such substrate materials, preferred are stainless steels, which are materials having high strength and high toughness, offer excellent corrosion resistance, and are useful as water-lubricated friction materials. Among such substrates, preferred are substrates coated with a DLC film, for reduced wear and decreased friction of the sliding portion.

The DLC film may have various properties according to the intended use. The DLC film may be selected from, for example, hydrogen-containing DLC films such as hydrogenated tetrahedral amorphous carbon (ta-C:H) films and hydrogenated amorphous carbon (a-C:H) films; and DLC films approximately devoid of hydrogen, such as tetrahedral amorphous carbon (ta-C) films and amorphous carbon (a-C) films. In the illustrated embodiment, the DLC film of the second member 3c is an a-C:H film.

The DLC film may be formed or deposited on the substrate using a known or common deposition technique. Non-limiting examples of such deposition techniques include physical vapor deposition techniques (PVDs) such as sputtering, arc ion plating, ion vapor deposition, ion beam epitaxy, and laser ablation (laser sputtering); and chemical vapor deposition techniques (CVDs) such as plasma CVD, thermal CVD, and photo-assisted CVD.

Transfer Layer Formation Step

The transfer layer formation step relatively slides the sliding surface of the first member and the sliding surface of the second member to transfer carbon derived from the second member to the first member surface and whereby forms a carbon transfer layer on the first member surface.

As illustrated in FIG. 2B, the carbonaceous lubricating material 4 is present between the first member 3b and the second member 3c. The relative sliding between the first member 3b and the second member 3c causes ND particles (not shown) contained in the carbonaceous lubricating material 4 to self-form a local high-energy field in a friction portion by the action of compressive sliding (sliding under pressure) between the sliding members. This probably promotes the reaction and transfers carbon derived from the second member 3c to the surface of the first member 3b.

In the illustrated embodiment, the surface of the first member 3b (SUS 304 ball) forms a low-friction face (first break-in, so-called initial break-in). On the low-friction face, an oxygen-rich film is formed. This is probably because such a tribochemical reaction in the system including ND particles forms a film having a low-friction face.

As illustrated in FIG. 2C, the friction due to compressive sliding between the first member 3b and the second member 3c causes the ND particles (not shown) in the carbonaceous lubricating material 4 to develop second break-in to thereby form a carbon transfer layer 2 including both $sp^2$ bonded carbon and spa bonded carbon on the surface of the first member 3b.

The carbon transfer layer 2 may have any thickness (layer thickness), but the thickness is preferably 100 to 1000 nm, more preferably 200 to 800 nm, and still more preferably 300 to 600 nm, to allow the carbon transfer layer to combine wear reducing effect, friction decreasing effect, adhesion strength, and durability with each other.

The carbon-transfer-layered sliding member production method according to the embodiment of present invention may preform the lubricating material application step and the transfer layer formation step each under a boundary lubrication condition. As used herein, the term "boundary lubrication condition" refers to a condition under which a high load acts upon the friction surface to cause the lubricating film to have a reduced thickness. Under such a condition, friction causes large loss. The carbon-transfer-layered sliding member production method according to the embodiment of present invention can produce a carbon-transfer-layered sliding member that can very effectively decrease friction and reduce wear even under such an extremely harsh boundary lubrication condition.

The carbon-transfer-layered sliding member formed through the steps can effectively decrease friction and reduce or retard wear. This allows the carbon transfer layer itself to undergo lower friction and retarded or reduced wear, and, simultaneously, allows the sliding-counter member to undergo lower friction and retarded or reduced wear.

The carbon-transfer-layered sliding member according to the embodiment of the present invention can very effectively decrease friction and reduce wear and is advantageously usable as materials for various products such as automobiles, machinery parts, medical devices, and household electrical appliances. The method according to the embodiment of the present invention for producing a carbon-transfer-layered sliding member is advantageously applicable to the production of the carbon-transfer-layered sliding member according to the embodiment of the present invention.

EXAMPLES

The present invention will be illustrated in further detail with reference to several examples below. It should be noted, however, that the examples are by no means intended to limit the scope of the invention.

Preparation of Carbonaceous Lubricating Material

A carbonaceous lubricating material was prepared through the following steps.

In a formation step, a shaped explosive equipped with an electric detonator was initially placed in a detonation pressure-tight chamber, and the chamber was hermetically sealed. The chamber was made of iron and had a capacity of 15 $m^3$. The explosive used was a mixture (0.50 kg) of trinitrotoluene (TNT) and cyclotrimethylenetrinitramine, namely, hexogen (RDX). The explosive had a mass ratio of TNT to RDX of 50:50. Next, the electric detonator was ignited to detonate the explosive in the chamber. The chamber and contents thereof were then cooled by being left at room temperature for 24 hours. After the natural cooling, a nanodiamond crude product (including agglutinates of nanodiamond particles formed by the detonation; and soot), which had been attached to the chamber inner wall, was obtained by scrapping off and collecting using a spatula. The formation step was repeated multiple times and gave a crude nanodiamond product.

Next, the crude nanodiamond product resulting from the formation step underwent an acid treatment in a purification step. Specifically, 200 g of the crude nanodiamond product was combined with 6 L of 10 mass percent hydrochloric acid to give a slurry, and the slurry underwent a heat treatment under reflux at normal atmospheric pressure for one hour. The acid treatment was performed at a heating temperature of 85° C. to 100° C. Next, after cooling, solids (including nanodiamond agglutinates and soot) were washed with water by decantation, where the water washing by decantation was repeated until the pH of the sedimentary solution increased and reached 2. The resulting article underwent a mixed acid treatment as solution oxidation in the purification step. Specifically, the sedimentary fluid (including nanodiamond agglutinates) resulting from decantation after the acid treatment was combined with 6 L of a 98 mass percent sulfuric acid aqueous solution and 1 L of a 69 mass percent nitric acid aqueous solution to give a slurry, and the slurry underwent a heat treatment under reflux at normal atmospheric pressure for 48 hours. The oxidation was performed at a heating temperature of 140° C. to 160° C. After being cooled, the solids (including nanodiamond agglutinates) were washed with water by decantation. A supernatant at the beginning of the water washing was colored; and the water washing by decantation was repeated until such a supernatant became visually transparent. Next, a drying step was performed. Specifically, 1000 mL of the nanodiamond-containing fluid resulting from the water washing treatment was spray-dried using a spray dryer (trade name Spray Dryer B-290, Nihon Buchi K. K.). This gave 50 g of a nanodiamond powder.

Next, an oxygen oxidation step was performed using a gas atmosphere furnace (trade name Gas Atmosphere Tube Furnace KTF045N1, Koyo Thermo Systems Co., Ltd.). Specifically, 4.5 g of the nanodiamond powder obtained as above stood in a furnace tube of the gas atmosphere furnace. Through the furnace tube, nitrogen gas continuously passed at a flow rate of 1 L/min for 30 minutes, the gas to pass was then changed from nitrogen to an oxygen-nitrogen gaseous mixture, and the gaseous mixture continuously passed through the furnace tube at a flow rate of 1 L/min. The gaseous mixture had an oxygen concentration of 4 volume percent. After the change to the gaseous mixture, the furnace was raised in internal temperature up to 400° C., which is a preset heating temperature. The temperature was raised at a rate of 10° C./min in the temperature range up to 380° C., which is lower than the preset heating temperature by 20° C.; and subsequently raised at a rate of 1° C./min in the range from 380° C. to 400° C. While keeping the furnace internal temperature to 400° C., the nanodiamond powder in the furnace underwent oxygen oxidation. This treatment was performed for 3 hours.

After the oxygen oxidation, the ND particles were evaluated for oxygen-containing functional groups such as carboxy group by FT-IR analysis according to a procedure mentioned below. The analysis detected an absorption Pi as a main peak at around 1780 cm$^{-1}$, which is assigned to C=O stretching vibration. The ND particles, as having the peak at a position of 1750 cm$^{-1}$ or higher, can serve as a starting material for a dispersion of ND having surface carboxy groups.

Next, a deaggregation step was performed. Specifically, 1.8 g of the nanodiamond powder resulting from the oxygen oxidation step were mixed with 28.2 mL of pure water in a 50-mL sample vial to give about 30 mL of a slurry. Next, the slurry was combined with a 1 N sodium hydroxide aqueous solution to adjust its pH and then underwent ultrasonication. The ultrasonication applied ultrasound to the slurry for 2 hours, using an ultrasonic applicator (trade name Ultrasonic Cleaner AS-3, AS ONE Corporation). The article was then subjected to bead milling using a bead mill Vertical Four-Vessel Sand Grinder LSG-4U-2L (trade name, AIMEX Co., Ltd.). Specifically, 30 mL of the slurry after ultrasonication and zirconia beads having a diameter of 30 μm were enclosed in the vessel, which is a 100-mL mill chamber (AIMEX Co., Ltd.) and underwent bead milling by operating the mill. The bead milling was performed at an amount of the zirconia beads of about 33% of the capacity of the mill chamber and a mill chamber rotation speed of 2570 rpm for a milling time of 2 hours. Next, the slurry or suspension resulting from the deaggregation step as above underwent a centrifugal treatment (classification operation) using a centrifugal separator. The centrifugal treatment was performed at a centrifugal force of 20000×g for a time of 10 minutes. The supernatant (10 mL) was recovered from the nanodiamond-containing fluid after the centrifugal treatment. This gave an aqueous ND dispersion including nanodiamonds dispersed in pure water. This dispersion was used as a material for the carbonaceous lubricating material. The aqueous ND dispersion was found to have a solids concentration or nanodiamond concentration of 59.1 g/L, a pH of 9.33, a particle diameter D50 (median diameter) of 3.97 nm, a particle diameter D90 of 7.20 nm, and a zeta potential of −42 mV.

Nanodiamond Concentration

The nanodiamond content (ND concentration) of the obtained aqueous ND dispersion was determined in the following manner. Specifically, 3 to 5 g of the dispersion were weighed, the weighed dispersion was then heated to evaporate water, and the residual dry matter (powder) was weighed using a precision balance. The ND concentration was calculated from the weight of the dispersion and the weight of the dry matter.

Particle Diameter

The particle diameter (median diameter D50, or D90) of nanodiamond particles contained in the obtained aqueous ND dispersion was measured using the Zetasizer Nano ZS (trade name, Malvern Panalytical Ltd.) by a dynamic light scattering technique (noncontact backscatter mode). Before the measurement, the aqueous ND dispersion was diluted with ultrapure water to have a solids concentration or nanodiamond concentration of 0.5 to 2.0 mass percent and then irradiated with ultrasound using an ultrasonic cleaner.

pH

The pH of the aqueous ND dispersion was measured using a pH test paper, Three Band pH Test Paper (trade name, AS ONE Corporation).

Zeta Potential

The zeta potential of nanodiamond particles contained in the aqueous ND dispersion was measured by laser Doppler electrophoresis using the Zetasizer Nano ZS (trade name, Malvern Panalytical Ltd.). Before measurement, the aqueous ND dispersion was diluted with ultrapure water to have a solids concentration or nanodiamond concentration of 0.2 mass percent and then irradiated with ultrasound using an ultrasonic cleaner. The zeta potential was measured at a temperature of 25° C.

FT-IR Analysis

Each of nanodiamond specimens after the oxygen oxidation and after the hydrogen reduction underwent Fourier transform infrared spectroscopic analysis (FT-IR analysis) using an FT-IR system, Spectrum 400 FT-IR (trade name, PerkinElmer Japan Co., Ltd.). In the measurement, infrared absorption spectra were measured while heating the specimens to be measured at 150° C. in a vacuum atmosphere. The heating in a vacuum atmosphere was performed using Heat Chamber Model-HC900 in combination with Thermo Controller Model TC-100WA each from S.T. Japan Inc.

Example 1

The above-prepared aqueous ND dispersion was combined with ultrapure water as a lubrication vehicle to adjust the concentration, and yielded a carbonaceous lubricating material A (aqueous fluid containing 0.001 mass percent of ND particles having surface carboxy groups).

A carbon-transfer-layered sliding member was prepared using a lubricant-dropping ball-on-disk tribo-tester 5 equipped with a load cell 59 (FIG. 3). A first member used was a SUS 304 ball 51 having a diameter of 8 mm (hereinafter also referred to as "SUS ball"); and a second member used was a SUJ2 disk 53 having a diameter of 30 mm and a thickness of 4 mm and bearing an a-C:H film (about 3 μm) deposited on the sliding surface (hereinafter also referred to as "DLC disk"). At the start of testing, 1 mL of the carbonaceous lubricating material A was dropped onto the sliding surface at the second member surface (namely, space between the sliding surface of the first member and the sliding surface of the second member), followed by sliding at room temperature. The sliding was performed at a sliding velocity of 10 mm/s under a load of 10 N for a sliding distance of 100 m. This formed a carbon transfer layer on the wear track of the first member and thereby gave a sliding member including a substrate as the first member and a carbon transfer layer on the substrate surface.

Example 2

A carbon-transfer-layered sliding member according to Example 2 was prepared by a procedure similar to that in Example 1, except for preparing and using a carbonaceous lubricating material B (aqueous fluid containing 0.01 mass percent of ND particles having surface carboxy groups).

Example 3

A carbon-transfer-layered sliding member according to Example 3 was prepared by a procedure similar to that in Example 1, except for preparing and using a carbonaceous lubricating material C (aqueous fluid containing 0.1 mass percent of ND particles having surface carboxy groups).

Comparative Example 1

A sliding member (SUS ball) according to Comparative Example 1 was prepared by a procedure similar to that in Example 1, except for using, as the lubricating material, water (ultrapure water) devoid of ND particles.

Test 1: Low-Friction Effect Evaluation

In Example 1, how the friction coefficient varied from the start to the end of testing was measured to evaluate the low-friction effect. Specifically, how the friction decreasing effect (low-friction effect) varied during the steps for producing the carbon-transfer-layered sliding member was evaluated. The result is illustrated in FIG. 4.

Test 2: Wear Loss Measurement

After the completion of the test 1, the wear loss was measured by a procedure as follows. Images of ball wear tracks at the surfaces of the individual sliding members in Example 1 and Comparative Example 1 were taken using a confocal laser microscope (trade name OPTELICS H1200, Lasertec Corporation). On the basis of the images, each wear track was approximated as a true circle to calculate a wear track radius. From the calculated wear track radius, a wear height was calculated according to Expression (1) below. In Expression (1), R represents the radius of the sliding member (SUS ball) and is 4 (mm); r represents the radius (mm) of the wear track; and h represents the height (mm) of the wear track (wear height).

[Math. 1]

$$h = R - (R^2 - r^2)^{\frac{1}{2}} \qquad (1)$$

Using the above-determined variables, a wear volume Vb ($mm^3$) was calculated according to Expression (2):

[Math. 2]

$$V_b = \frac{h\pi(3r^2 + h^2)}{6} \qquad (2)$$

The volume loss indicated by the wear volume Vb ($mm^3$) was defined as the wear loss. The results are illustrated in FIG. 5 and FIG. 6.

Test 3: Carbon Transfer Layer Analysis

A sample carbon transfer layer was analyzed by Raman spectroscopic analysis and scanning electron microscopy-energy dispersive X-ray spectrometry (SEM-EDS), and on the basis of the contact angle with water and the arithmetic mean surface roughness (Ra). In Comparative Example 1, the sliding surface of the sliding member (SUS ball) was evaluated.

Test 3-1: Contact Angle with Water

A droplet (5 μL) of water was dropped onto the surface of each specimen after the completion of the test 1, and the angle between the surface and the droplet was determined from an image using a contact angle meter, Micro Contact Angle Meter MCA-3 (trade name, Kyowa Interface Science Co., Ltd.). The results are illustrated in FIG. 5 and FIG. 6.

Test 3-2: Raman Spectroscopic Analysis

The surface of each specimen after the completion of the test 1 was irradiated using a laser Raman spectrophotometer, NRS-5100 (trade name, JASCO Corporation) under the following measurement conditions. The results are illustrated in FIG. 7.

Measuring light source: 532 nm
Output: 0.8 mW
Slit width: 100 by 1000 mm
Exposure time: 10 seconds
Number of scans: 4

Test 3-3: Scanning Electron Microscopy-Energy Dispersive X-Ray Spectrometry (SEM-EDS)

The surface of each specimen after the completion of the test 1 was analyzed using an energy dispersive X-ray spectroscopic analyzer, X-Max50 (trade name, OXFORD Instruments) at an acceleration voltage of 5 kV. The results are illustrated in FIG. 8 and FIG. 9. On the basis of the SEM image, the surface quality (appearance) was observed.

Test 3-4: Arithmetic Mean Surface Roughness (Ra)

The surface of each specimen after the completion of the test 1 was evaluated for the arithmetic mean surface roughness (Ra) by measurement using a scanning probe microscope, AFM 5300E (trade name, former name: E-sweep, Hitachi High-Tech Science Corporation) according to Japanese Industrial Standard (JIS) B 0601:2013. The measurement was performed both in a parallel direction and a vertical direction to the sliding direction in sliding. The results are illustrated in FIG. 10.

Test 4: Relation Between Number of ND Particles and Sliding Distance

The sliding members according to Examples 1 to 3 each underwent the test 1. On the basis of the change in friction coefficient, how the number of ND particles in the carbonaceous lubricating material per unit area of the sliding track of the second member affects the sliding distance until the occurrence of the second break-in was evaluated. In the test 1, each (1 mL) of the carbonaceous lubricating materials A, B, and C, when dropped onto space between the sliding surface of the first member and the sliding surface of the second member, uniformly spread on the sliding track of the second member, by the action of friction. Thus, the number of ND particles per sliding track unit area can be determined by dividing the number of ND particles (concentration) contained in the drops of each of the carbonaceous lubricating materials A, B, and C by the sliding track area of the second member. The number of ND particles in 1 mL of each of the carbonaceous lubricating materials A, B, and C was calculated assuming that the ND particles have a diameter of 5 nm and a density of 3.2 g/cm$^3$. The results are illustrated in FIG. 11.

Consideration of Results

FIG. 4 depicts wear curves of the first member (SUS 304 ball), illustrating typical friction characteristics in water according to Comparative Example 1 (indicated as C1) and in the carbonaceous lubricating material A (aqueous fluid containing 0.01 mass percent of ND particles) according to Example 1 (indicated as E1). The addition of the carbonaceous lubricating material A, which contains ND particles, reduced the friction coefficient by half, namely, from 0.06 to 0.03; and also maintained such low-friction effect even at a sliding distance of up to 100 m.

FIG. 5 and FIG. 6 illustrate how the ball wear loss Vb b (mm$^3$) and the contact angle with water (degree) vary depending on the sliding distance (m), respectively in Comparative Example 1 and in Example 1. Regarding wear in terms of wear rate, Example 1 had a wear rate that was comparable to that in Comparative Example 1 at an early stage at a sliding distance of less than 10 m, but significantly decreased thereafter, and reached $1.2 \times 10^{-8}$ mm$^3$/Nm in terms of relative wear loss, which is lower than that in Comparative Example 1 by about one digit. With an increasing sliding distance, Comparative Example 1 tended to have an increasing ball wear loss, whereas Example 1 had a ball wear loss that reached a constant value at a sliding distance of about 20 m and showed approximately no increase thereafter up to a sliding distance of 100 m. Specifically, the results demonstrated that the addition of ND particles to a lubricating material is effective as a technique of reducing both friction and wear. Comparative Example 1 tended to have a slightly decreasing contact angle with water with an increasing sliding distance, whereas Example 1 tended to have an increasing contact angle with water with an increasing sliding distance (at a sliding distance of 40 m or greater). As described above, Example 1 offered a change in wettability with water.

The results illustrated in FIGS. 4 to 6 indicate that at first Example 1 underwent initial break-in (first break-in) comparable to that in water in Comparative Example 1, then underwent second break-in, which is unique to the carbonaceous lubricating material A containing ND particles, and, as a result, offered low friction.

FIG. 7 depicts Raman spectra of Example 1 (indicated as E1), Comparative Example 1 (indicated as C1), the DLC disk at the start of testing (indicated as D1), and the ND particles at the start of testing (indicated as N1). Example 1 (E1) gave a G peak of the carbon transfer layer appearing at around 1600 cm$^{-1}$. The Raman spectrum of Example (E1) rises from left to right. As carbon materials, DLC (D1) and nanodiamonds (N1) are commonly known to have a G peak respectively at around 1550 cm$^{-1}$ and at around 1650 cm$^{-1}$. However, Example 1 (E1) gave a G peak appearing at a position apparently different from those of D1, N1, and C1. Although the exact mechanism remains unknown, the data indicate that the change in Raman spectrum functions as a key to develop the wear reducing effect and the friction decreasing effect. The Raman spectrum of Example 1 had a D peak integrated intensity (Id) of 3897.47, a G peak integrated intensity (Ig) of 2517.1, and a ratio Id/(Id+Ig) of 0.601. The results demonstrated that the carbon transfer layer of Example 1 has a ratio spa/(sp$^2$+sp$^3$) of the sp$^3$ bonded carbon to the totality of the sp$^2$ bonded carbon and the sp$^3$ bonded carbon of 0.1 or more.

FIG. 8 graphically depicts the mass percentages of atoms in the sliding members at the start of testing, and after testing in Comparative Example 1 and Example 1. The atomic mass percentages in the graph of FIG. 8 are as in Table 1.

TABLE 1

| Atomic species | At the start of testing | Comparative Example 1 | Example 1 |
| --- | --- | --- | --- |
| C | 2 | 2 | 43 |
| O | 1 | 19 | 7 |
| Cr | 15 | 19 | 8 |
| Fe | 70 | 53 | 35 |
| Ni | 12 | 7 | 7 |

In Example 1, the sliding surface upon development of the low-friction function and friction reducing function included a large amount of carbon atoms, and this indicates that the sliding surface borne a carbon transfer layer. In contrast, the sliding surface in Comparative Example 1 had increase in oxygen atom, but had no increase in carbon atom. The SEM image of Example 1 indicates that an extremely smooth carbon transfer layer was uniformly formed on the entire real contact portion, whose surface offered approximately no defects such as separation (flaking) and slipping off.

FIG. 9 graphically depicts the EDS analysis results of wear tracks of the first member during the first break-in period, at the early stage of the second break-in, and after the second break-in. The atomic mass percentages in the graph of FIG. 9 are as in Table 2.

TABLE 2

| Atomic species | First break-in period | Early stage of second break-in | After second break-in |
| --- | --- | --- | --- |
| C | 7 | 17 | 53 |
| O | 5 | 5 | 4 |
| Cr | 14 | 13 | 14 |
| Fe | 65 | 56 | 27 |
| Ni | 9 | 9 | 3 |

The results in Table 2 demonstrate that carbon and oxygen at the surface of the sliding member during the first break-in period increased approximately comparably with each other, as compared with the initial surface. The wear rate during this period is relatively high, and this indicates that break-in caused predominantly by mechanical wear that is independent on the presence of ND particles occurs in this period. In the second break-in period, which is unique and caused by the carbonaceous lubricating material A, carbon present in the wear track abruptly increased in percentage, and this indicates that a surface layer was formed during this period, where the surface layer had such a carbon structure having an arithmetic mean surface roughness (Ra) on the order of nanometers (FIG. 10), which carbon structure appears upon development of low friction. Specifically, the development of the second break-in, which holds the key to develop low friction, is considered as the effect of the ND particles contained in the carbonaceous lubricating material A.

Observation of the SEM images of Comparative Example 1 and Example 1 indicate that Comparative Example 1 offered sharp, streaky sliding tracks appearing in parallel to the sliding plane, whereas Example 1 offered extremely smooth sliding tracks as if chamfered. The surface of the observed area in Example 1 had approximately no defects such as separation (flaking) and slipping off.

FIG. 10B graphically depicts the arithmetic mean surface roughness (Ra) of the specimens after the test 1. In FIG. 1, P and V respectively represent the parallel direction and the vertical direction to the sliding direction. In particular, the arithmetic mean surface roughness (Ra) in the parallel direction to the sliding direction is about 10 nm upon development of low friction, and this indicates that the carbon transfer layer (sliding surface) has an extremely smooth surface.

FIG. 11 illustrates how the sliding distance until the occurrence of the second break-in varies depending on the number of ND particles per unit area of the sliding track in the second member (DLC disk). With an increasing number of ND particles per unit area of the sliding track in the second member, the sliding distance before the occurrence of the second break-in, which leads to low friction, decreases, and this demonstrates that the presence of ND particles brought about the second break-in. The first member surface after the second break-in brought by the carbonaceous lubricating material had an arithmetic mean surface roughness (Ra) on the order of several nanometers (FIG. 10B). This is probably because ND particles present in a large number on the sliding track applied energy uniformly to the second member (DLC disk), promoted carbon structural change and wear in the entire sliding track, and enhanced transfer of carbon onto the first member (SUS ball) to form an extremely smooth surface.

These results indicate that, as friction characteristics, sliding between the first member (SUS ball) and the second member (DLC disk) through the carbonaceous lubricating material offers a friction coefficient of 0.03, which is one-half that in the water-lubricated sliding without the addition of carbon; and that the sliding through the carbonaceous lubricating material induces break-in that promotes transfer of carbon derived from the DLC film of the second member to the surface of the first member (SUS ball).

This reveals that the carbon-transfer-layered sliding member according to the embodiment of the present invention is excellently effective both for lower friction and reduced wear.

Some embodiments of the present invention have been described in detail above. It should be noted, however, that the embodiments are never construed to limit the scope of the invention, and various design or engineering changes are possible without departing from the spirit and scope of the invention as set forth in the appended claims.

REFERENCE SIGNS LIST 1 carbon-transfer-layered sliding member
2 carbon transfer layer
3a substrate
3b first member
3c second member
4 carbonaceous lubricating material
5 lubricant-dropping ball-on-disk tribo-tester
50 base
51 SUS ball
52 ball holder
53 DLC disk
54 disk holder
55 motor
56 load
57a, 57b bearing
58 pivot
59 load cell

The invention claimed is:

1. A sliding member comprising:
a substrate; and
a carbon transfer layer being disposed on a surface of the substrate and including $sp^2$ bonded carbon, $sp^3$ bonded carbon, and iron and giving a G band appearing at 1570 to 1640 $cm^{-1}$ in a Raman spectrum obtained by Raman spectroscopic analysis using a 532-nm measurement light source.

2. The sliding member according to claim 1, wherein the carbon transfer layer has a ratio $sp^3/(sp^2+sp^3)$ of 0.1 or more, where the ratio $sp^3/(sp^2+sp^3)$ is a ratio of the $sp^3$ bonded carbon to the totality of the $sp^2$ bonded carbon and the $sp^3$ bonded carbon.

3. The sliding member according to claim 1, wherein the carbon transfer layer gives a D band appearing at 1300 to 1400 $cm^{-1}$ in a Raman spectrum obtained by Raman spectroscopic analysis using a 532-nm measurement light source.

4. The sliding member according to claim 1, wherein the carbon transfer layer has a thickness of 100 to 1000 nm.

5. The sliding member according to claim 1, wherein the carbon transfer layer has a ratio $sp^3/(sp^2+sp^3)$ of 0.5 or more, where the ratio $sp^3/(sp^2+sp^3)$ is a ratio of the $sp^3$ bonded carbon to the totality of the $sp^2$ bonded carbon and the $sp^3$ bonded carbon.

6. The sliding member according to claim 3, wherein the carbon transfer layer has a ratio $sp^3/(sp^2+sp^3)$ of 0.5 or more, where the ratio $sp^3/(sp^2+sp^3)$ is a ratio of the $sp^3$ bonded carbon to the totality of the $sp^2$ bonded carbon and the $sp^3$ bonded carbon.

7. The sliding member according to claim 1, wherein the carbon transfer layer has a ratio $sp^3/(sp^2+sp^3)$ of 0.5 or more and less than 0.98, where the ratio $sp^3/(sp^2+sp^3)$ is a ratio of the $sp^3$ bonded carbon to the totality of the $sp^2$ bonded carbon and the $sp^3$ bonded carbon.

8. The sliding member according to claim 3, wherein the carbon transfer layer has a ratio $sp^3/(sp^2+sp^3)$ of 0.5 or more and less than 0.98, where the ratio $sp^3/(sp^2+sp^3)$ is a ratio of the $sp^3$ bonded carbon to the totality of the $sp^2$ bonded carbon and the $sp^3$ bonded carbon.

9. The sliding member according to claim 1,
wherein the carbon transfer layer has a thickness of 300 to 600 nm.

10. The sliding member according to claim 5,
wherein the carbon transfer layer has a thickness of 100 to 1000 nm.

11. The sliding member according to claim 7,
wherein the carbon transfer layer has a thickness of 100 to 1000 nm.

12. The sliding member according to claim 8,
wherein the carbon transfer layer has a thickness of 100 to 1000 nm.

13. The sliding member according to claim 5,
wherein the carbon transfer layer has a thickness of 300 to 600 nm.

14. The sliding member according to claim 7,
wherein the carbon transfer layer has a thickness of 300 to 600 nm.

15. The sliding member according to claim 8,
wherein the carbon transfer layer has a thickness of 300 to 600 nm.

16. The sliding member according to claim 3,
wherein an intensity of the D band is greater than an intensity of the G band.

\* \* \* \* \*